(12) United States Patent
Dosluoglu

(10) Patent No.: US 11,605,580 B2
(45) Date of Patent: Mar. 14, 2023

(54) SWITCHED POWER STAGE WITH INTEGRATED PASSIVE COMPONENTS

(71) Applicant: Chaoyang Semiconductor Jiangyin Technology Co., Ltd., Jiangyin (CN)

(72) Inventor: Taner Dosluoglu, New York, NY (US)

(73) Assignee: CHAOYANG SEMICONDUCTOR (SHANGHAI) CO., LTD, Yangpu District (CN)

( * ) Notice: Subject to any disclaimer, the term of this patent is extended or adjusted under 35 U.S.C. 154(b) by 56 days.

(21) Appl. No.: 16/883,737

(22) Filed: May 26, 2020

(65) Prior Publication Data

US 2021/0111111 A1 Apr. 15, 2021

Related U.S. Application Data

(63) Continuation of application No. 14/956,279, filed on Dec. 1, 2015, now abandoned.
(Continued)

(51) Int. Cl.
*H01L 23/498* (2006.01)
*H01L 23/00* (2006.01)
(Continued)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49838* (2013.01); *H01L 24/17* (2013.01); *H01L 24/81* (2013.01); *H05K 3/3436* (2013.01); *H01L 23/49816* (2013.01); *H01L 24/13* (2013.01);
(Continued)

(58) Field of Classification Search
USPC .......................................................... 257/379
See application file for complete search history.

(56) References Cited

U.S. PATENT DOCUMENTS 6,301,121 B1 * 10/2001 Lin ..................... H01L 23/5382
361/783
6,417,463 B1 7/2002 Cornelius et al.
(Continued)

FOREIGN PATENT DOCUMENTS

CN 102870175 A 1/2013
CN 102934227 A 2/2013
(Continued)

OTHER PUBLICATIONS

International Search Report on related PCT Application No. PCT/US2015/063268 from International Searching Authority (KIPO) dated Jul. 20, 2016.
(Continued)

*Primary Examiner* — Nduka E Ojeh
(74) *Attorney, Agent, or Firm* — KOS IP Law LLP

(57) ABSTRACT

A scalable switching regulator architecture may include an integrated inductor. The integrated inductor may include vias or pillars in a multi-layer substrate, with selected vias coupled at one end by a redistribution layer of the multi-layer substrate and, variously, coupled at another end by a metal layer of a silicon integrated circuit chip or by a further redistribution layer of the multi-layer substrate. The vias may be coupled to the silicon integrated circuit chip by micro-balls, with the vias and micro-balls arranged in arrays.

9 Claims, 14 Drawing Sheets

Related U.S. Application Data

(60) Provisional application No. 62/086,081, filed on Dec. 1, 2014.

(51) Int. Cl.
| | | |
|---|---|---|
| *H01L 21/48* | (2006.01) | |
| *H05K 3/34* | (2006.01) | |
| *H01L 27/02* | (2006.01) | |
| *H01L 25/065* | (2006.01) | |
| *H01L 27/092* | (2006.01) | |

(52) U.S. Cl.
CPC .......... *H01L 24/16* (2013.01); *H01L 25/0655* (2013.01); *H01L 27/0203* (2013.01); *H01L 27/092* (2013.01); *H01L 2224/13025* (2013.01); *H01L 2224/13147* (2013.01); *H01L 2224/16227* (2013.01); *H01L 2224/16235* (2013.01); *H01L 2224/16265* (2013.01); *H01L 2224/17177* (2013.01); *H01L 2224/81191* (2013.01); *H01L 2924/1206* (2013.01); *H01L 2924/14* (2013.01); *H01L 2924/1427* (2013.01); *H01L 2924/15311* (2013.01); *H01L 2924/19103* (2013.01)

(56) References Cited

U.S. PATENT DOCUMENTS

| | | | | |
|---|---|---|---|---|
| 6,671,865 | B1* | 12/2003 | Ali | ............ G06F 30/39 |
| | | | | 257/E23.07 |
| 2006/0022336 | A1 | 2/2006 | Franzon et al. | |
| 2009/0322299 | A1* | 12/2009 | Michishita | ............ H02M 3/156 |
| | | | | 323/282 |
| 2010/0096725 | A1 | 4/2010 | Shi et al. | |
| 2010/0244208 | A1 | 9/2010 | Pagaila et al. | |
| 2011/0089927 | A1 | 4/2011 | Yamazaki et al. | |
| 2011/0317387 | A1 | 12/2011 | Pan et al. | |
| 2013/0187255 | A1* | 7/2013 | Wang | ............ H01L 28/10 |
| | | | | 438/381 |
| 2014/0203397 | A1* | 7/2014 | Yen | ............ H01L 21/76885 |
| | | | | 438/381 |
| 2014/0225706 | A1* | 8/2014 | Doyle | ............ H01F 41/02 |
| | | | | 336/200 |
| 2014/0264734 | A1 | 9/2014 | Luo et al. | |
| 2015/0235952 | A1 | 8/2015 | Pan et al. | |
| 2016/0233192 | A1* | 8/2016 | Dosluoglu | ............ H01L 23/49822 |

FOREIGN PATENT DOCUMENTS

| | | |
|---|---|---|
| TW | 201143264 A | 12/2011 |
| TW | 201431022 A | 8/2014 |

OTHER PUBLICATIONS

Written Opinion on related PCT Application No. PC Authority (KIPO) dated Jul. 20, 2016.

European Extended Search Report on related Euro European Patent Office (EPO) dated Dec. 1, 2017.

Office action with a search report on related Chinese Patent Application No. 201580071579.3 from the China National Intellectual Property Administration (CNIPA) dated Feb. 15, 2019.

U.S. Appl. No. 14/956,279, filed Dec. 1, 2015, Taner Dosluoglu, US 2016-0155692 A1, Office Action dated May 18, 2017, Final Office Action dated Feb. 9, 2018, Examiner's Answer dated Dec. 27, 2018, Patent Board Decision dated Mar. 23, 2020.

\* cited by examiner

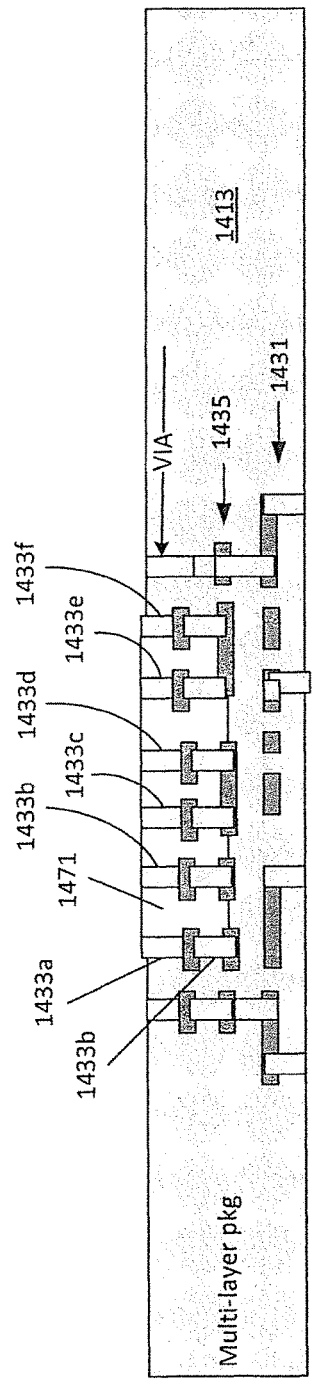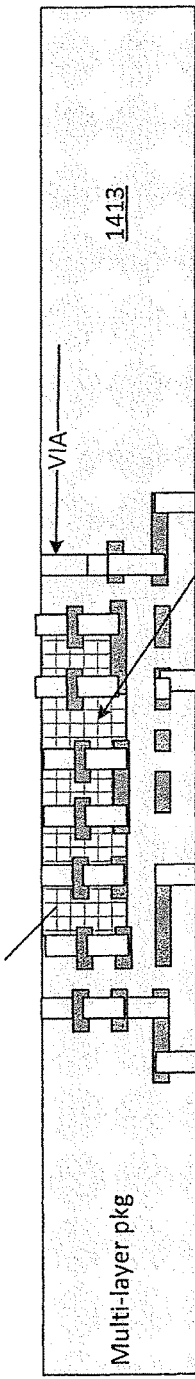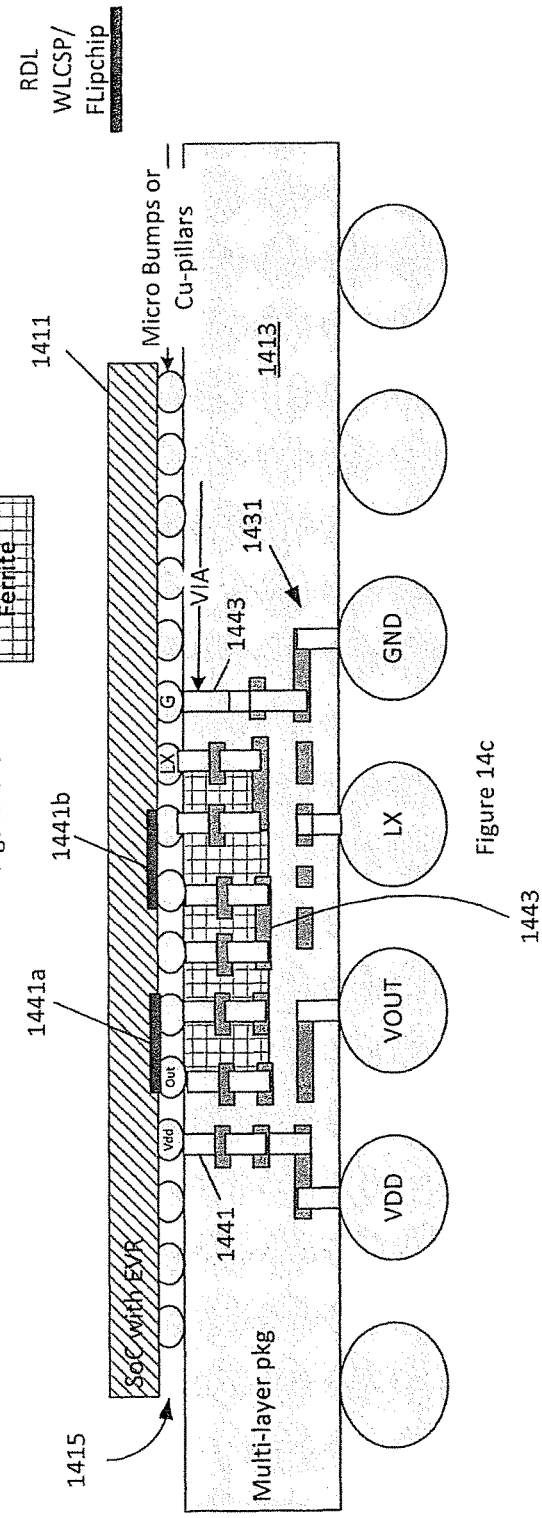

SWITCHED POWER STAGE WITH INTEGRATED PASSIVE COMPONENTS

CROSS-REFERENCE TO RELATED APPLICATIONS

This application is a continuation of U.S. patent application Ser. No. 14/956,279, filed Dec. 1, 2015, which claims the benefit of the filing date of U.S. Provisional Patent Application No. 62/086,081, filed on Dec. 1, 2014, the disclosures of which are incorporated by reference herein.

BACKGROUND OF THE INVENTION

A power distribution network (PDN) in a system-on-chip (SoC) used in various mobile device typically includes on-chip metallization layers connecting to a package substrate via micro-bumps or copper pillars. The micro-bumps may be connected to balls of the package by vias and one or more redistribution layers (RDLs) within the package, with the balls of the package coupled to a printed circuit board (PCB). This generally results in a significant parasitic inductance which has become a significant limiting factor in the performance of the mobile devices as higher frequencies and higher currents generate local transient effects, which are also referred to as droops due to fast changes in the load currents.

In order to overcome this difficulty embedded voltage regulators (eVR) and various transient control circuits have been proposed. For efficiency the voltage regulators are typically switching regulators with inductors. One of the biggest challenges, however, in implementing an eVR is to manufacture inductors with high inductance to resistance value (L/R: inductance [nH] per resistance [mohms]) with small form factor (current rating per square millimeter).

BRIEF SUMMARY OF THE INVENTION

With respect to some embodiments, this disclosure discusses a scalable switching regulator architecture with an integrated inductor and a methodology to optimize the various performance parameters against the area of the structure. In some embodiments the combined switches and inductor are constructed as a unit cell and can be combined to form larger elements as required for higher current drive capability and multiphase operation.

Three examples are provided with less than 0.25 mm^2 area for this unit cell. These examples can be worked out for the complete range of process nodes from 180 nm down to 28 nm and beyond (e.g. 10 nm FinFET).

It is fundamental for any inductor to optimize the magnetomotive force for a given core area and maximize the area of the core with respect to the magnetic field path length. Magnetomotive force is proportional to the current and number of turns (N) the current make around the core. Inductance for a well-defined core structure is proportional to Area*N^2/Length.

Any current flow (for example on a wire or a micro-bump) creates magnetic field circles. For a given geometry of the power distribution network the overall magnetic field results in what is typically referred to as parasitic inductance.

In some aspects of the invention, a structure utilizing micro-bumps and RDL metallization to selectively creates desired magnetic field paths maximizing and minimizing the inductance on top of the switches of a switching voltage regulator. The maximum current capability of the micro-bumps and the size of the switches are chosen to match the inductor core area, magnetic field path length and the number of turns that can be constructed to arrive at desired inductance with maximum L/R ratio (Inductance/resistance). This is also matched to the area of the switches so that the inductor can be built on top of the corresponding switches. This structure can then be taken as the unit element to form the switching regulator. The unit element can be a single phase of a multiphase buck or the unit elements with coupling inductors.

Some embodiments in accordance with aspects of the invention provide a package including an integrated circuit, comprising: an integrated circuit (IC) chip including a system-on-chip (SoC) and a voltage regulator, the voltage regulator including first and second transistors connected in series; a multi-layer substrate coupled to the IC chip by micro-bumps, including at least one array of micro-bumps, the multi-layer substrate including at least one redistribution layer and a plurality of vias, with selected vias extending from selected ones of the micro-bumps of the at least one array of micro-bumps coupled by the at least one redistribution layer in pairs, with the selected vias electrically coupled to others of the selected vias about the micro-bumps; wherein the selected vias and the micro-bumps of the at least one array of micro-bumps form at least part of an inductor structure; and wherein the at least part of an inductor structure is positioned to correspond to a layout area of the first and second transistors of the voltage regulator.

Other embodiments in accordance with aspects of the invention provide a method for use in providing a system-on-chip (SoC) including an embedded voltage regulator, comprising: forming a redistribution layer for a multi-layer substrate; forming at least one array of vias in the multi-layer substrate, the at least one array of vias forming at least part of an inductor, at least some of the vias of the at least one array of vias electrically connected by connections provided by the redistribution layer; depositing a magnetic material between vias of the at least one array of vias; connecting an IC chip including the voltage regulator to the at least one array of vias, the IC chip connected to the at least one array of vias by at least one array of micro-bumps, the at least one array of micro-bumps underlying a layout of switching transistors of the voltage regulator, at least some of the micro-bumps electrically connected by connections provided by a metal layer of the IC chip, the at least one array of vias, the at least one array of micro-bumps, the connections provided by the redistribution layer and the connections provided by the metal layer forming an inductor.

These and other aspects of the invention are more fully comprehended upon review of this disclosure.

BRIEF DESCRIPTION OF THE FIGURES

FIGS. 14a-c illustrate fabrication of an inductor within a package substrate, with the package substrate coupled to an SOC, in accordance with aspects of the invention.

DETAILED DESCRIPTION

Figure 1:
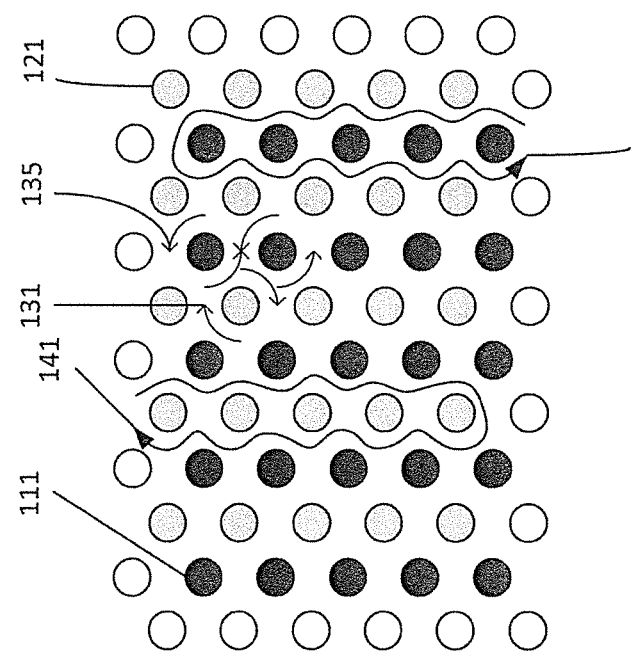
FIG. 1 illustrates a tightly backed micro-bump array for coupling a silicon substrate with a package.

FIG. 1 illustrates a tightly backed micro-bump array for coupling a silicon substrate with a package. The silicon substrate may be, for example, a silicon substrate for an SoC. The micro-bumps of FIG. 1 may be considered as being on the silicon substrate, a first set of micro-bumps illustrated with a darker cross-section, e.g., micro-bump 111, conveying current out of the silicon substrate, and a second set of micro-bumps illustrated with a lighter cross-section, e.g. micro-bump 121, conveying current into the silicon substrate. Generally, as current flows through a micro-bump, a magnetic field is generated around the micro-bump. The magnetic fields around the micro-bumps conveying current into the silicon substrate having a first magnetic field orientation 131 and fields around the micro-bumps conveying current out of the silicon substrate having a second opposing magnetic field orientation 135. For a line of micro-bumps flowing current in the same direction the magnetic field in between micro-bumps is cancelled, and a longer magnetic field path may be formed, for example a magnetic field path 141 for a first line of micro-bumps conveying current into the silicon substrate and a magnetic field path 145 for a second line of micro-bumps conveying current out of the silicon substrate.

Figure 2:
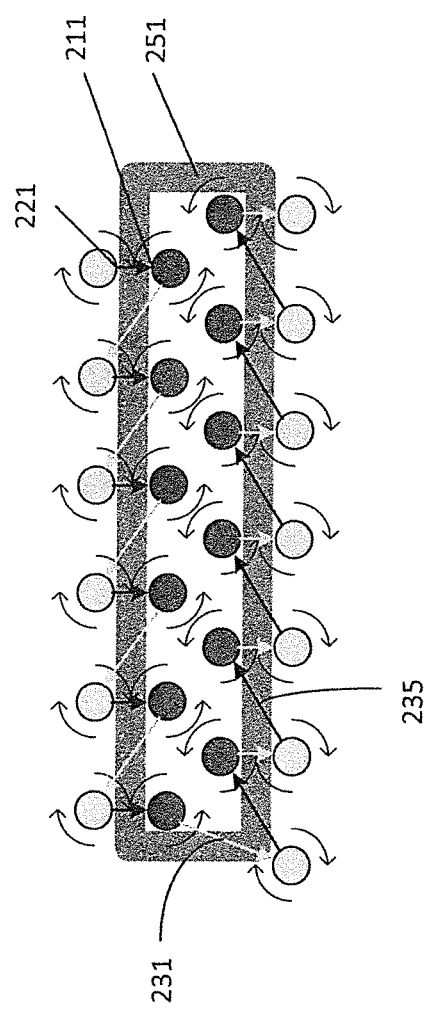
FIG. 2 illustrates a micro-bump array in accordance with aspects of the invention.

FIG. 2 illustrates a micro-bump array in accordance with aspects of the invention. In FIG. 2, a micro-bump array includes a first set of micro-bumps for conveying current into a silicon substrate, for example of an SoC, and a second set of micro-bumps for conveying current out of the silicon substrate. In FIG. 2, the first set of micro-bumps are shown with a lighter cross-section, e.g. micro-bump 221, and the second set of micro-bumps are shown with a darker cross-section, e.g. micro-bump 211. In various embodiments the micro-bumps are ordered in such a way to form a closed loop magnetic field loop. In the embodiment of FIG. 2, the micro-bumps of the second set of micro-bumps are arranged in two adjacent and parallel lines, with the micro-bumps of each line offset from the micro-bumps of the other line. The micro-bumps of the first set of micro-bumps are also arranged in two parallel lines, parallel to the two lines of micro-bumps of the first set, with the two lines of micro-bumps of the second set between the lines of the micro-bumps of the first set, and with micro-bumps of each line of the first set adjacent, without offset, the micro-bumps of the closest line of the second set. With the micro-bumps so arranged, a magnetic field path is formed around the micro-bumps of the second set, between the micro-bumps of the first set and the micro-bumps of the second set.

In some embodiments the micro-bumps of FIG. 2 are arranged in a single conductive structure. For example, a via or copper pillar in a package may extend from each micro-bump to a lower redistribution layer (RDL) (or upper RDL, depending on whether the silicon substrate is on top of or under the silicon substrate). Each micro-bump of the first set of micro-bumps is effectively electrically coupled to an adjacent corresponding micro-bump of the second set of micro-bumps, and also effectively electrically coupled to a next over bump of the second set of micro-bumps (with one bridging connection coupling a micro-bump of each of the first set and second set from non-adjacent lines). For one pair of adjacent lines of micro-bumps of the two sets, this may be accomplished by way of lower RDL metal coupling vias or copper pillars for each micro-bump, with silicon bottom (or top, depending on orientation) metal coupling the other pair of adjacent lines of micro-bumps of the two sets. In FIG. 2, this is shown schematically with lighter lines, e.g. line 231, coupling micro-bumps in the lower RDL, and darker lines, e.g., line 235, coupling micro-bumps in silicon bottom metal, although in some embodiments the silicon bottom metal connections may be replaced by upper RDL connections. In some embodiments, direction of arrows associated with the lines shows direction of current flow in the lower RDL and the silicon bottom metal. In the example of FIG. 2 loops are formed around a magnetic field core, magnetic field path formed by the current loops is shown as a thick line 251.

Figure 3:
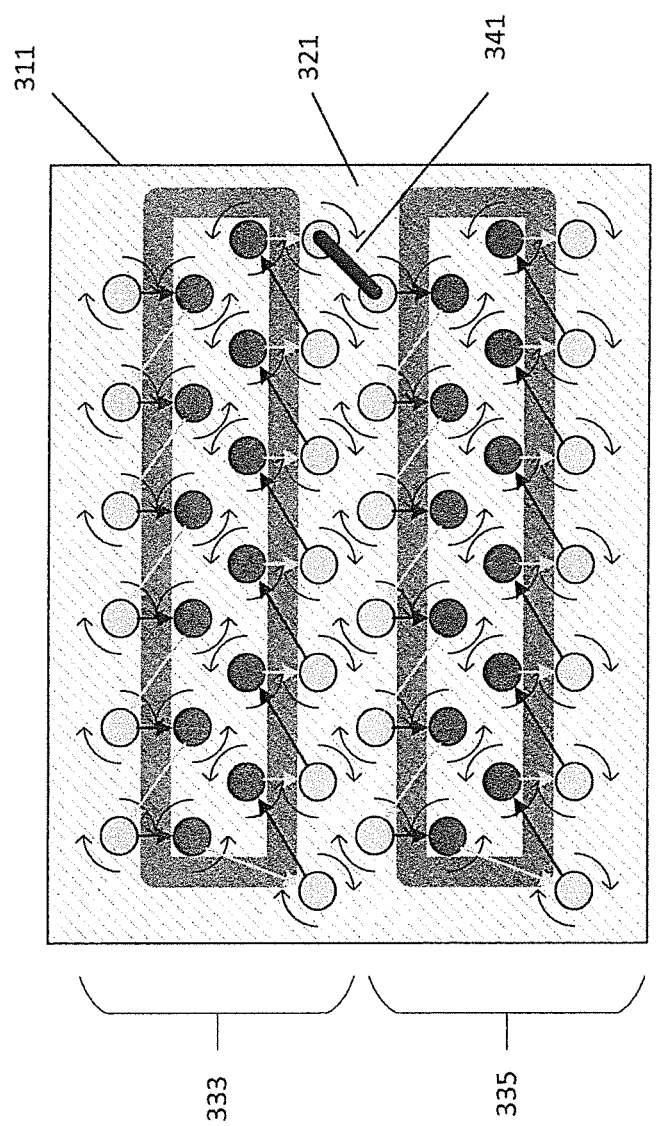
FIG. 3 illustrates an integrated inductor in accordance with aspects of the invention.

FIG. 3 illustrates an integrated inductor in accordance with aspects of the invention. As illustrated in FIG. 3, the integrated inductor core of FIG. 3 includes two of the micro-bump arrays of FIG. 2, with a first micro-bump array 333 and a second micro-bump array 335 arranged side-by-side. In the embodiment illustrated in FIG. 3, the lines of micro-bumps forming each micro-bump array are parallel to one another. In some embodiments, and as illustrated in FIG. 3, a magnetic material 321 is in a package between vias or copper pillars extending from the micro-bumps. The magnetic material may be, for example, ferrite, forming a ferrite core for the inductor.

As further shown in FIG. 3, the first micro-bump array and second micro-bump array may be electrically connected together using a metal trace or wire 341, for example part of a semi-conductor metal layer, with the metal trace connecting a micro-bump from the first micro-bump array to a micro-bump from the second micro-bump array.

Figure 4:
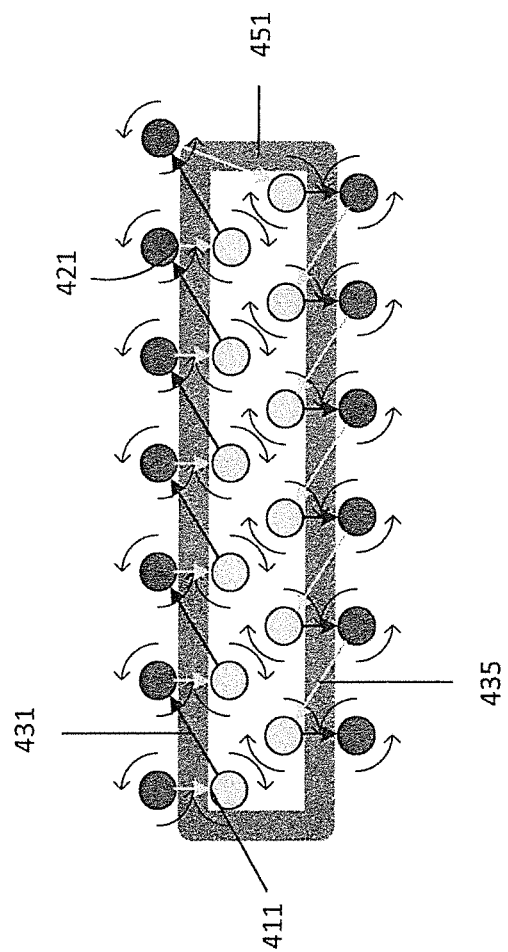
FIG. 4 illustrates a further micro-bump array in accordance with aspects of the invention.

The packing of what may be considered a magnetic volume can be improved by using a further micro-bump array as shown in FIG. 4. FIG. 4 illustrates a further micro-bump array in accordance with aspects of the invention. Like the micro-bump array of FIG. 2, the micro-bump array of FIG. 4 includes a first set of micro-bumps, for example including a micro-bump 411, and a second set of micro-bumps, for example including a micro-bump 421. The arrangement of the first set of micro-bumps and the second set of micro-bumps of the array of FIG. 4 is also like that of the array of FIG. 2, and the micro-bumps of FIG. 4 are also generally electrically coupled as the micro-bumps of FIG. 2, for example using RDL and/or semiconductor metal layer connections 431 and 435.

In the micro-bump array of FIG. 4, however, the conveying of current into or out of a silicon substrate is reversed when compared to the micro-bump array of FIG. 2. Accordingly, for the micro-bump array of FIG. 4, the first set of micro-bumps, which may be considered to provide peripheral lines of micro-bumps, are for conveying current out of the silicon substrate, and the second set of micro-bumps, which may be considered to provide interior lines of micro-bumps, are for conveying current out of the silicon substrate. With current conveyed according to such an arrangement, a magnetic field loop 451 may be formed.

Figure 5:
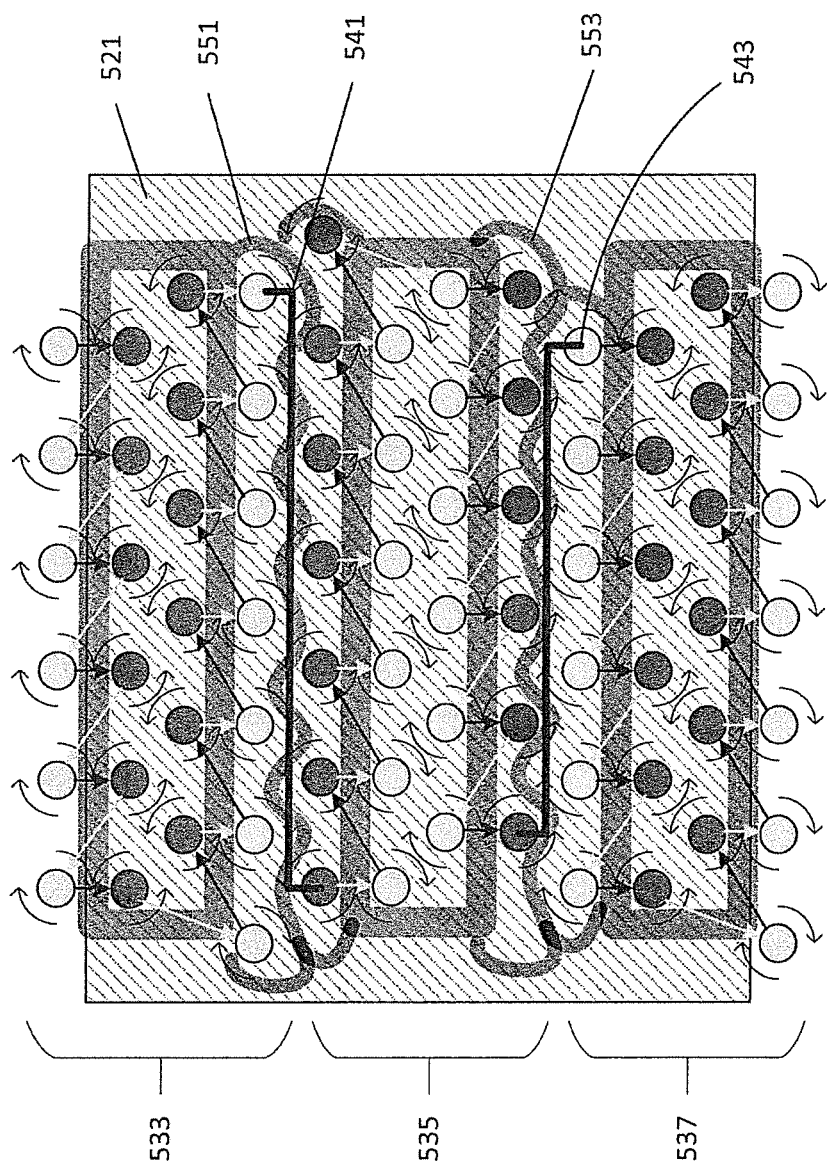
FIG. 5 shows a further integrated inductor in accordance with aspects of the invention.

FIG. 5 shows a further integrated inductor in accordance with aspects of the invention. The integrated inductor of FIG. 5 is like that of FIG. 3 but additionally utilizes the micro-bump array of FIG. 4. The integrated inductor of FIG. 5 includes a first micro-bump array 533 and a second micro-bump array 537, with the first and second micro-bump arrays as discussed with respect to FIGS. 2 and 3. Unlike the integrated inductor of FIG. 3, however, is interposed a third micro-bump array 535, with the third micro-bump array as discussed with respect to FIG. 4.

In addition, in some embodiments, and as illustrated in FIG. 5, a magnetic material 521 is in a package between vias or copper pillars extending from the micro-bumps. The magnetic material may be, for example, ferrite, forming a ferrite core for the inductor. Also as further shown in FIG. 5, the first and third micro-bump arrays may be connected together using a metal trace or wire 541, with the metal trace 541 connecting a micro-bump from the first micro-bump array to a micro-bump from the third micro-bump array. Similarly, the third and second micro-bump arrays may be connected together using a metal trace or wire 543, with the metal trace 543 connecting a micro-bump from the third micro-bump array to a micro-bump from the second micro-bump array.

The integrated inductor of FIG. 5, compared to the integrated inductor of FIG. 3, has opposing current flows through adjacent lines of parallel micro-bumps of different micro-bump arrays. The opposing current flows generates further magnetic paths 551 and 553, shown in FIG. 5 with wiggly lines. The opposing current flows increase mutual inductance of adjacent conductors extending from the micro-bumps, increasing overall inductance of the structure.

Figure 6:
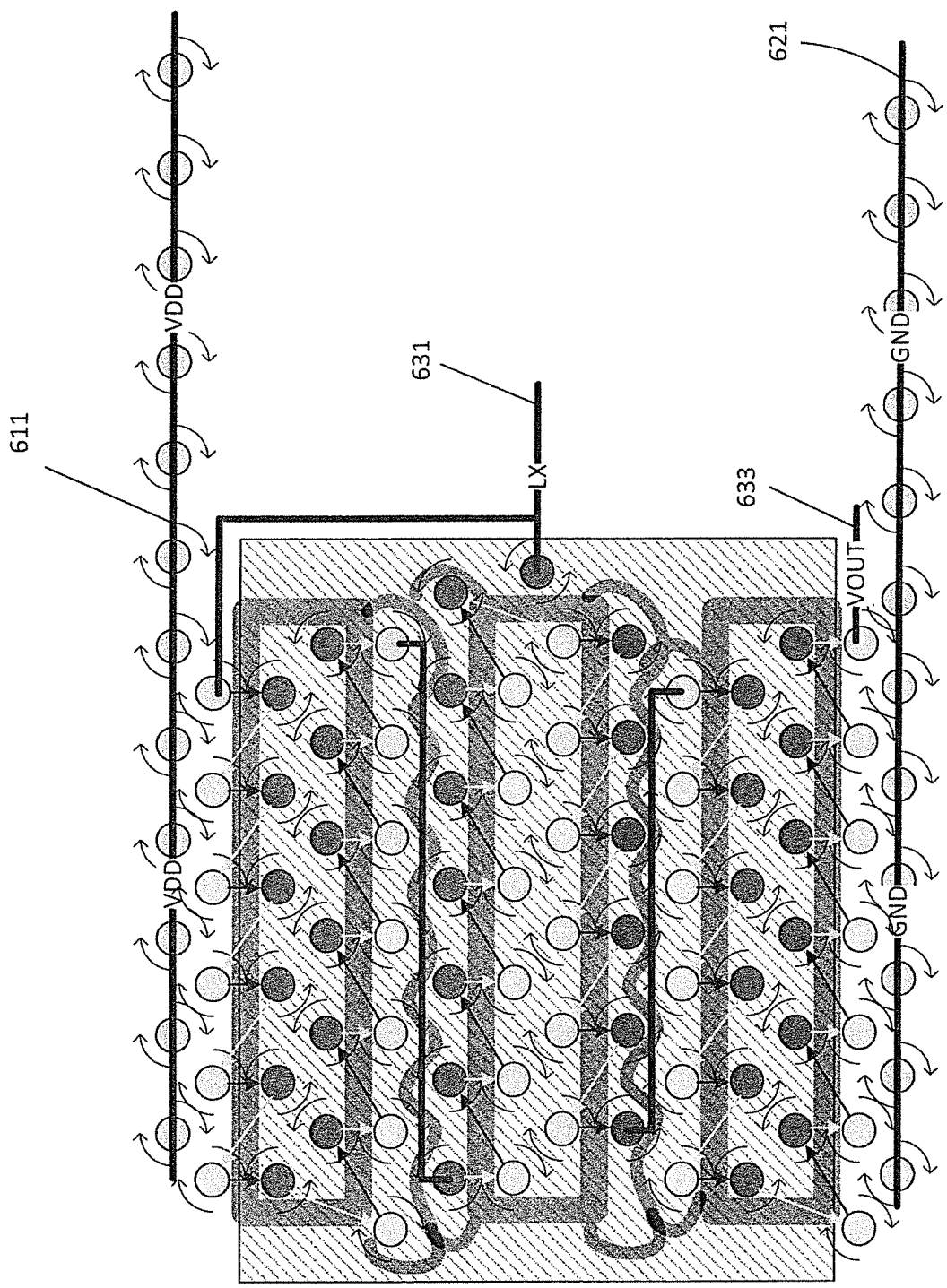
FIG. 6 shows the integrated inductor of FIG. 5, along with connections for a power converter.

FIG. 6 shows the integrated inductor of FIG. 5, along with connections for a power converter. The power converter may be, for example, a buck power converter.

For a buck power converter, which may be a buck regulator, it may be preferred to minimize inductance for the supply and ground connections, while maximizing the inductance at the same time. In FIG. 6 VDD connections 611 and GND connections 621 are in regions where magnetic flux is reduced, by micro-bumps for the VDD connections and GND connections being placed next to micro-bumps having a similar direction of current flow. In the embodiment of FIG. 6, the VDD micro-bumps are arranged linearly along an outer line of micro-bumps of the first micro-bump array, and the GND micro-bumps are arranged linearly along an outer line of micro-bumps of the second micro-bump array. In this regard, it may be noted that for a buck power converter, current for VDD and current for GND flow in the same direction, which is different from a typical circuit where VDD and GND current flows would be in opposite directions. Furthermore, the VDD and GND micro-bumps extend linearly past areas including the micro-bumps of the micro-bump arrays, providing a longer strip of micro-bump connections, which may extend the effective magnetic field path and further lower the inductance of the VDD and GND connections.

In FIG. 6 an inductor LX node 631 and a voltage output VOUT node 633 of a buck regulator are also labeled. The LX node is shown at end of the third (middle) micro-bump array, with a connection to a first micro-bump of the first micro-bump array. The VOUT node is shown coupled to a last micro-bump of the second micro-bump array.

Figure 7:
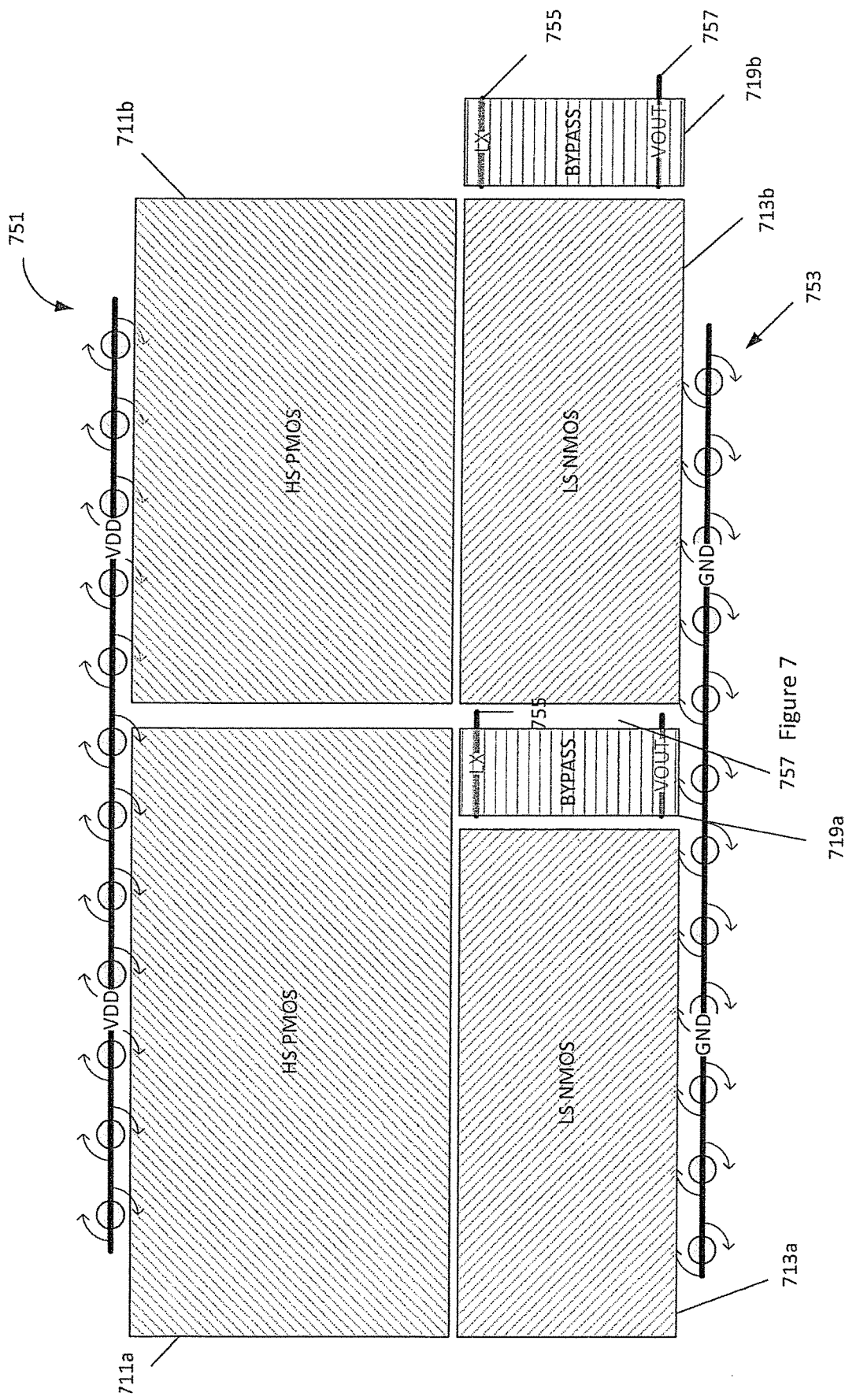
FIG. 7 shows a sample layout relationship for the VDD and GND connections of the structure of FIG. 6 for a buck regulator including a bypass switch.
Figure 8:
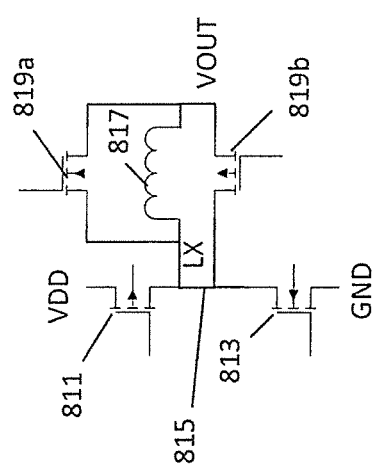
FIG. 8 shows a partial circuit schematic of a buck regulator including a bypass switch.

In many embodiments the structure of FIG. 6 overlays (or underlies, depending on silicon/package orientation) a layout of switches of a buck regulator. FIG. 7 shows a sample layout relationship for the VDD and GND connections of the structure of FIG. 6 for a buck regulator including a bypass switch. FIG. 8 shows a partial circuit schematic of a buck regulator including a bypass switch. As shown in FIG. 8, the buck regulator with bypass switch includes a high side switch 811 and a low side switch 813 coupled between VDD and GND, with an LX node 815 between the high side switch and the low side switch. An inductor 817 couples the LX node with a VOUT node, with a first bypass switch 819a and a second bypass switch 819b coupled in parallel to the inductor. Although two bypass switches are shown in FIG. 8, it should be recognized that in various embodiments only a single bypass switch may be provided.

Returning to FIG. 7, a layout for the buck regulator with bypass switch includes areas for the high side switch 711a,b and areas for the low side switch 713a,b. The areas for the high side switch and the low side switch are between connections and micro-bumps for VDD 751 and for GND 753. As shown in FIG. 7, the VDD connections about the high side switch and the GND connections about the low side switch. The connections and micro-bumps for VDD and GND are as discussed with respect to FIG. 6, namely outside and flanking opposing sides of an inductive core area. Also as shown in FIG. 7, bypass switch(es) layout areas include a first area 719a between portions of the low side switch area and a second area 719b to a side of the low side switch area. An LX node connection 755 is shown on one side of the first and second areas for the bypass switch(es), with a VOUT node connection 757 on an opposing side.

Figure 9:
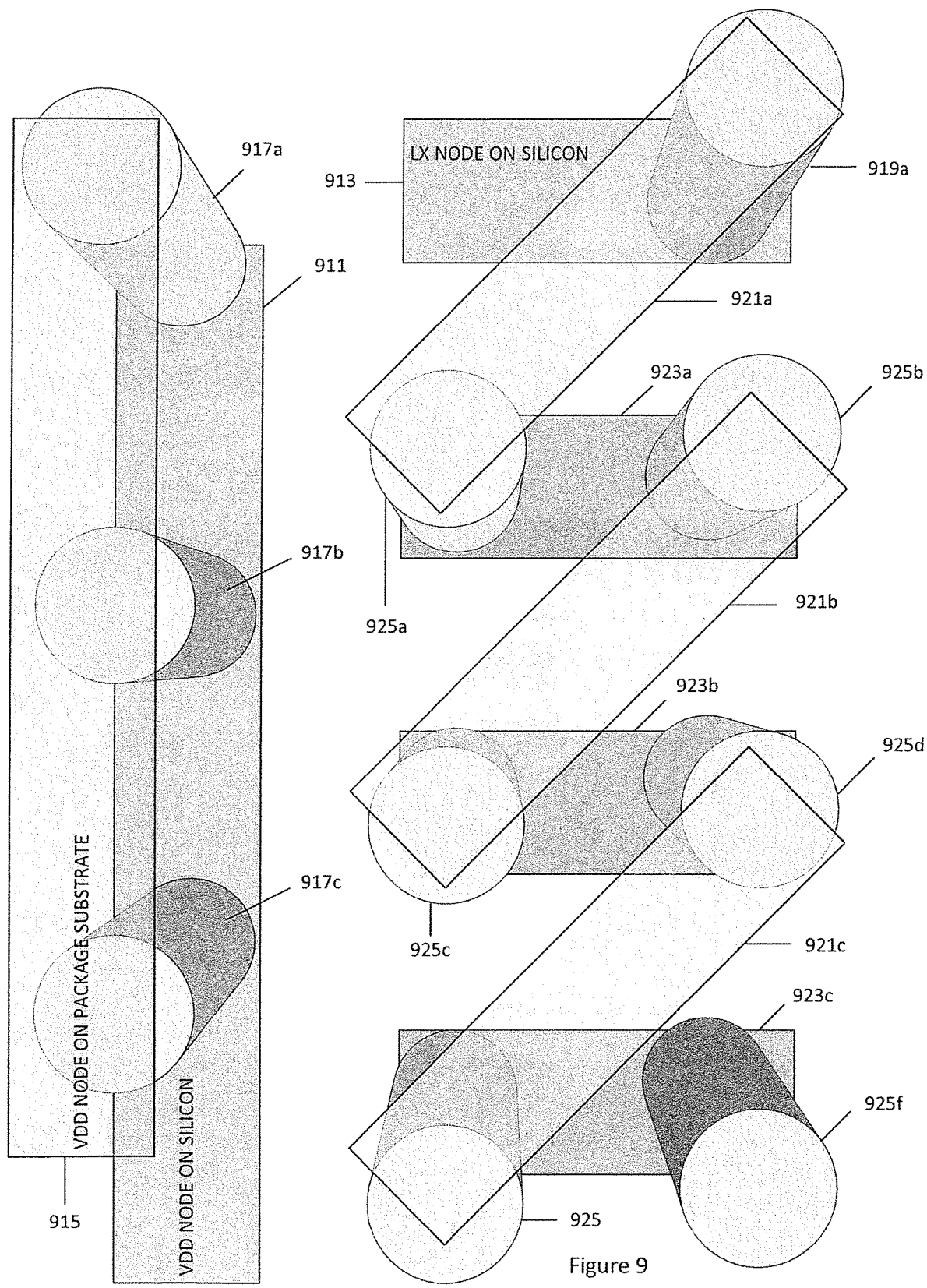
FIG. 9 illustrates an example three dimensional layout including a VDD node on silicon and an LX node on silicon.

FIG. 9 illustrates an example three dimensional layout including a VDD node 911 on silicon and an LX node 913 on silicon. The layout shows the VDD node on silicon connected to a VDD node 915 on a package substrate, shown parallel to the silicon, by a plurality of pillars 917a-c. The LX node on silicon is also connected to an RDL (and in various embodiments the package substrate) by a pillar 919a, with a sequence of RDL connectors 921a-c, each of which are coupled to one of a sequence of connectors on silicon 923a-c by respective pillars 925a-f. As illustrated in FIG. 8, the relative positions of the connectors and pillars coupled to the LX node substantially mirror portions of the structure discussed with respect to FIG. 2.

For each of the inductive structures discussed above; the ratio of the effective magnetic field path length compared to the core area contained within the micro-bumps and upper/lower RDL metals generally determines the inductance that can be obtained. This is also proportional to the relative permeability of the material filling the core area.

Several examples are discussed in the section below. An aspect of this invention relates to the optimization of the inductor architecture and the switching area.

Generally optimization considerations include:
1) Current carrying capability of the bumps and the thickness of the RDL layer connecting the bumps defines the initial choice of number of bumps per phase. In examples 1 & 2 this is 1 A per phase and in example 3 this is 3 A/phase;
2) For a given process node the typical current density of the optimized switches define the area (4 A/mm^2 for 180 nm, >15 A/mm^2 for 28 nm);
3) For the switch size also relates to the optimum switching frequency and the size of the target inductance;

4) Given the relative permeability, one can determine the optimum number of turns to maximize Figure of Merit;
5) In the examples below; this is limited by the bump dimensions. One would otherwise reduce the area of the combined structure for the maximum power delivery density;
6) In addition to the permeability one may wish to confirm the field strength against the saturation of the magnetic material core.

Example 1 with a Structure as Shown in FIG. 6

Process node: 180 nm
Current rating: 1 A per bump
Magnetic Path Length/Core Area: 1.8 mm/(70 um×50 um)×3 (3 "cores" as shown in FIG. 6)
Number of Turns: 13 per core
Total Inductance: 1 nH (air core) @ Lx node
Vdd/GND inductance <35 pH
Note that the core area shown in the figures, bounded by magnetic path lines, can be filled with magnetic material and the 1 nH would increase proportional to the relative permeability of the material. Ideally the VDD/GND area would not be filled with the magnetic material and will stay more or less <50 pH.

Figure 10:
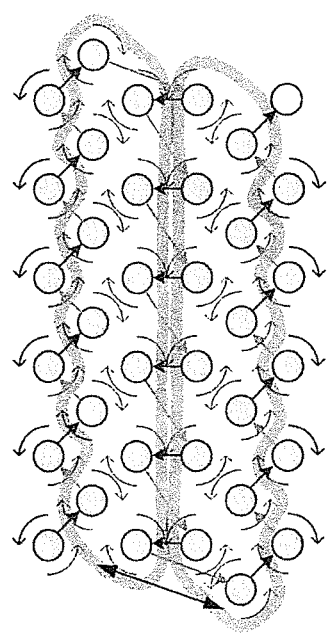
FIG. 10 shows structure for a further example integrated inductor in accordance with aspects of the invention.

Example 2 with a Structure as Shown in FIG. 10

Figure 11:
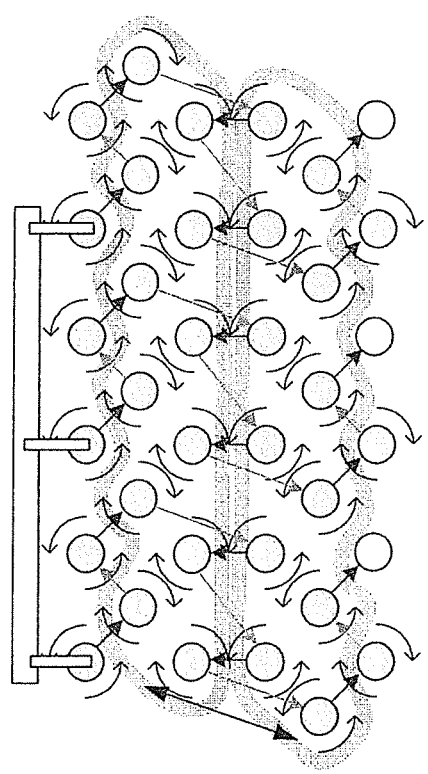
FIG. 11 shows structure for a yet further example integrated inductor in accordance with aspects of the invention.

Process node: 180 nm
Current rating: 1 A per bump
Magnetic Path Length/Core Area: 1.8 mm/(70 um×50 um)
Number of Turns: 18 per core
Total Inductance (Relative permeability>60): >19 nH @ Lx node
Total Resistance: 12 mohms
Figure of Merit: L/R=1.57 nH/mohms @ 4 A/mm^2
Vdd/GND inductance <35 pH Example 3 with a Structure as Shown in FIG. 11

Figure 12:
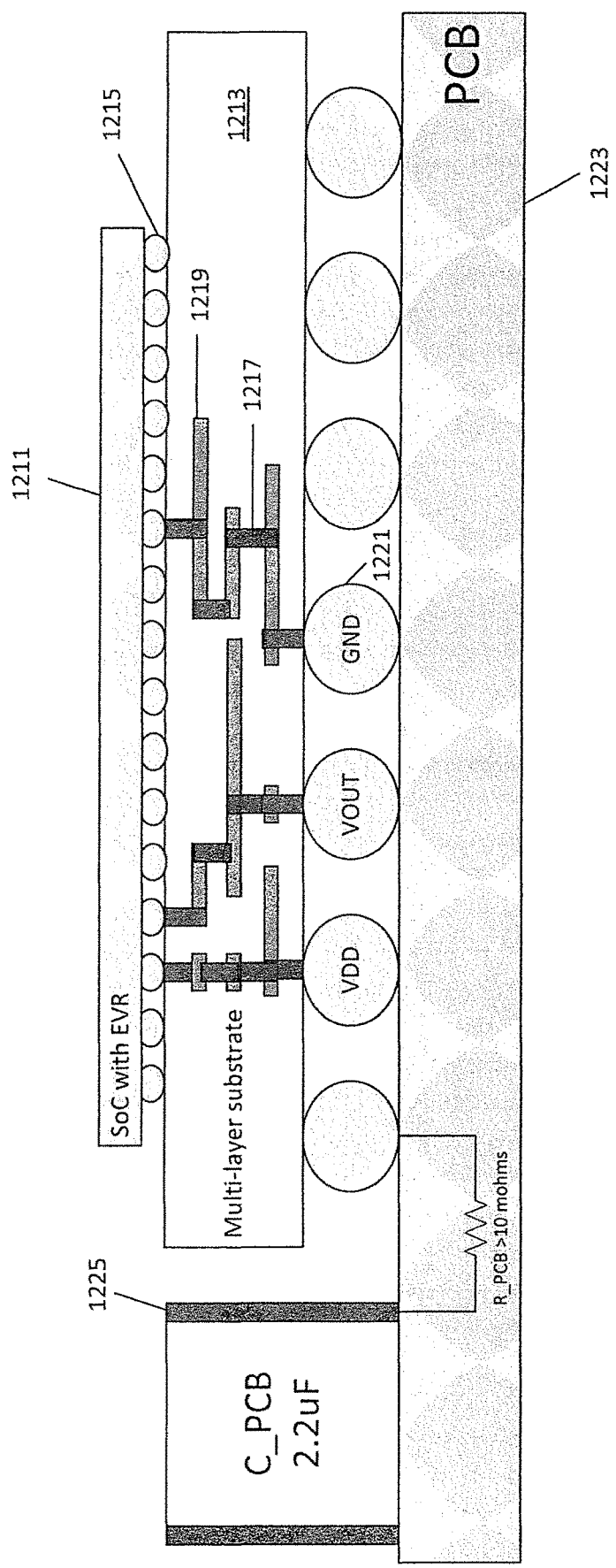
FIG. 12 shows a typical flip chip multi-layer substrate package.

Process node: 28 nm
Current rating: 3 A (1 A per bump)
Magnetic Path Length/Core Area: 1.8 mm/(70 um×50 um)
Number of Turns: 6 per core
Total Inductance (Relative permeability>60): >2 nH @ Lx node
Total Resistance: 4 mohms
L/R=0.5 nH/mohms
Figure of Merit: L/R=0.5 nH/mohms @ 12 A/mm^2
FIG. 12 shows a typical flip chip multi-layer substrate package. In FIG. 12 the RDLs and in between vias are used for routing. In FIG. 12, an SOC (including an embedded voltage regulator) 1211 is coupled to signal paths in a multi-layer substrate 1213 by way of micro-bumps 1215. Vias, for example via 1217, and RDLs, for example RDL 1219, electrically couple various of the micro-bumps to various solder balls, for example a ground GND solder ball 1221. The solder balls in turn electrically couple the signal paths of the multi-layer substrate to a printed circuit board (PCB) 1223. As shown in FIG. 12, the PCB additionally includes an external capacitor 1225.
In aspects of this invention, the combination of micro-bumps, RDL(s), and vias in between create structures that confine a magnetic field in a closed loop or decrease the mutual coupling of adjacent pins of a semiconductor device.

Figure 13:
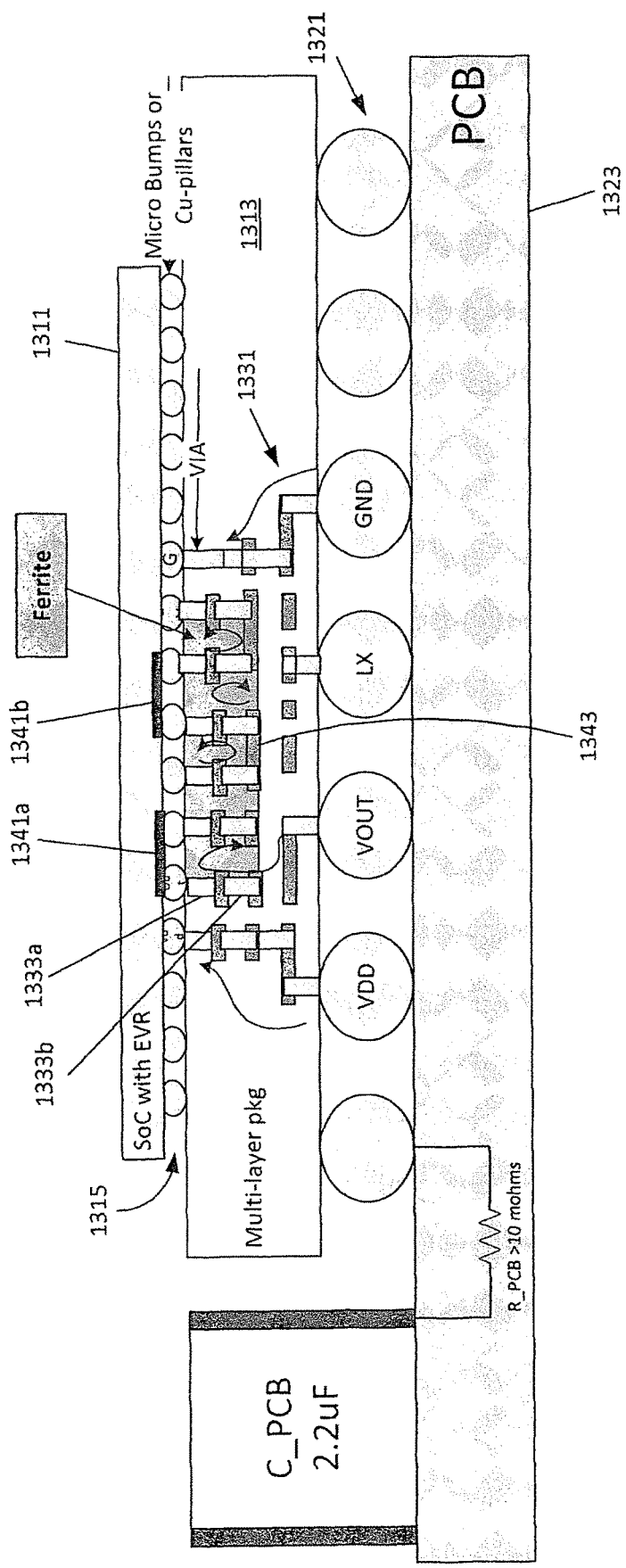
FIG. 13 illustrates a cross-section of an example multi-layer package substrate and its environment in accordance with aspects of the invention.

The micro-bump arrays that have been discussed above can be illustrated, at least in part, with the cross-section of FIG. 13.
FIG. 13 illustrates a cross-section of an example multi-layer package substrate and its environment in accordance with aspects of the invention. As was discussed with respect to FIG. 12, an SOC 1311 is electrically coupled to signal paths of a multi-layer substrate 1313 by micro-bumps 1315. The signal paths of the substrate are also electrically coupled to a PCB 1323 by solder balls 1321.
In the example of FIG. 13, a bottom RDL layer 1331 is still used for signal routing, but the micro-bumps and two vias, e.g. vias 1333a,b, stacked-up create a magnetic core area. As shown in FIG. 13, selected micro-bumps for the magnetic core may be coupled by top silicon metal, e.g. top silicon metal 1341a,b, as discussed with respect to other FIGS. Similarly, selected vias may be coupled by an RDL layer 1343. The current flow within the magnetic core area is shown as a darker area and this area is constructed above the switches and maximizes the volume for magnetic path.
In some embodiments, and as shown in FIG. 13, this area is filled with magnetic material (e.g. ferrite) to further increase the inductance. The connection to the LX node may be in the third dimension into a pin as shown previously. Note that the inductor structure use the entire available volume between LX and VOUT (except for the routing layer, if needed)
It has been a continuing trend for the inductors used in consumer electronics to shrink in dimensions and operate at higher frequencies. For discrete inductors this trend may summarized in the table below for inductors available as off the shelf components

| Inductor Value and Dimensions | Volume (mm^3) | L/R (nH/ mohms) | I/Area (Amps/ mm^2) | I/Vol (Amps/ mm^3) |
|---|---|---|---|---|
| 2.2 uH, 2.5 × 2 × 1 | 5.0 | 27.5 | 0.6 | 0.6 |
| 60 nh, 0402, 1.5 A | 0.5 | 1.33 | 2.25 | 3 |
| 36 nH, 0402, 2 A | 0.5 | 1 | 3 | 4 |

For integrated solutions, the data is significantly dispersed. One possible implementation for the discussed solution can be summarized in the table below.

| Inductor Value and Dimensions | Volume (mm^3) | L/R (nH/ mohms) | I/Area (Amps/ mm^2) | I/Vol (Amps/ mm^3) |
|---|---|---|---|---|
| 18 nH, 1 A, N = 18 | 0.05 | 0.45 | 4 | 20 |
| 5 nH, 2 A, N = 9 | 0.05 | 0.225 | 8 | 40 |
| 2 nH, 3 A, N = 6 | 0.05 | 0.15 | 12 | 60 |

Given the basic information, we can determine possible structure for the off-the-shelf components and compare this with the discussed structures. This is provided in the table below for the 0402 size components (closer to integrated inductor dimensions). In addition, there are several additional factors that may be considered. As the core area decreases the magnetomotive force and corresponding magnetic field strength generally makes preferable a choice of magnetic material with low relative permeability in order to limit the field strength in the core that can be accommodated without saturating the core. In some embodiments, for the integrated inductors one could choose magnetic core material with relative permeability in the range of 20-80 in order to reach particular inductance targets and still keep the saturation flux density below 1 Tesla. In some embodiments the overall volume utilization may decrease from 21% down to 12.6%, which may be expected due to limited volume available. Any patterns of the bump arrangement can be analyzed for higher percentage as a figure of merit.

| I(A) | Relative permeability | Mlength | Acore | Rm | N turns | L (nH) | Fm | (mTesla) | Vol Ratio |
|---|---|---|---|---|---|---|---|---|---|
| 2.1 | 600 | 3 | 3.5E−02 | 114.3 | 2 | 35.0 | 4.2 | 1050 | 0.21 |
| 1.4 | 600 | 3 | 3.5E−02 | 114.3 | 3 | 78.8 | 4.2 | 1050 | 0.21 |
| 1 | 20 | 1.8 | 3.5E−03 | 20571.4 | 18 | 15.8 | 18 | 250 | 0.126 |
| 2 | 20 | 1.8 | 3.5E−03 | 20571.4 | 9 | 3.9 | 18 | 250 | 0.126 |
| 3 | 20 | 1.8 | 3.5E−03 | 20571.4 | 6 | 1.8 | 18 | 250 | 0.126 |

FIGS. 14a-c illustrate fabrication of an inductor within a package substrate, with the package substrate coupled to an SOC, in accordance with aspects of the invention. Turning to FIG. 14a, a multi-layered substrate 1413 includes a plurality of vias, including vias 1433a-f extending to atop of the multi-layer substrate. The vias 1433a-f are generally linearly arranged, with via 1433a at one end of via 1433f at an opposing end. In many embodiments the vias are the vias coupled to the micro-bump arrays discussed previously. The vias may be in the form of pillars in some embodiments. In the embodiment of FIG. 14a, the vias may be considered two stacked up vias, as they extend past an intermediate redistribution layer to a lower redistribution layer 1435. The lower redistribution layer couples some of the vias 1433a-f. In most embodiments the lower redistribution layer couples vias from different sets of vias, using the terminology "sets of vias" to correspond to vias coupled to sets of micro-bumps as previously discussed. In the case of the embodiment of FIG. 14a, the multi-layer substrate also includes a bottom redistribution layer 1431, which may be used for signal routing. As shown in FIG. 14a, the multi-layered substrate includes an open volume 1471 between the vias 1433a and 1433f. The open volume may be formed, for example, by etching of the multi-layer substrate.

FIG. 14b shows magnetic material deposited within the open volume to form a magnetic core 1481. In many embodiment, the magnetic material is ferrite or nickel zinc ferrite with relative permeability appropriate for the integrated inductor. As shown in FIG. 14b, the magnetic material is designated with checkered pattern cross-sections.

Turning to FIG. 14c, an SOC 1411 is electrically coupled to signal paths of the multi-layer substrate 1413 by micro-bumps 1415. As shown in FIG. 14c, selected micro-bumps coupled to some of the vias 1433a-f are coupled by top silicon metal, e.g. top silicon metal 1441a,b. In most embodiments the top silicon metal couples vias from different sets of vias. In other embodiments the coupling is provided by a fourth RDL layer, instead of the top silicon metal. The signal paths of the substrate may also be electrically coupled to a PCB (not shown) by solder balls 1421. In some embodiments, the SOC is electrically coupled to the substrate at a supply node (Vdd), a load output node (Out), an inductor LX node, and a ground node (G). In some embodiments, the solder balls provide coupling of the substrate to the PCB (not shown) also at the supply, load output, inductor LX, and ground nodes. In this regard, a via 1441 providing a path for VDD signals is located outside and adjacent a first side of the vias 1433a-f, and a via 1443 is located outside and adjacent an opposing side of the vias 1433a-f.

Although the invention has been discussed with respect to various embodiments, it should be recognized that the invention comprises the novel and non-obvious claims supported by this disclosure.

What is claimed is:

1. A package including an integrated circuit, comprising:
an integrated circuit (IC) chip including a system-on-chip (SoC) and a voltage regulator, the voltage regulator including a high side switch and a low side switch connected in series;
a multi-layer substrate coupled to the IC chip by micro-bumps, including at least one array of micro-bumps, the multi-layer substrate including at least one redistribution layer and a plurality of vias, with selected vias extending from selected ones of the micro-bumps of the at least one array of micro-bumps coupled by the at least one redistribution layer in pairs, with the selected vias electrically coupled to others of the selected vias about the micro-bumps;
wherein the selected vias and the micro-bumps of the at least one array of micro-bumps form an inductor structure; and
wherein the inductor structure is matched in size with a layout area of the high side switch and low side switch of the voltage regulator, and is positioned on top of the high side switch and the low side switch.

2. The package including an integrated circuit of claim 1, wherein the multi-layer substrate includes a redistribution layer electrically coupling the selected vias to others of the selected vias about the micro-bumps.

3. The package including an integrated circuit of claim 1, wherein a metal layer of the IC chip electrically couples the selected vias to others of the selected vias about the micro-bumps.

4. The package including an integrated circuit of claim 1, wherein the at least one array of micro-bumps are arranged in a pattern and connected so as to form at least one closed loop magnetic field during operation of the IC chip.

5. The package including an integrated circuit of claim 1, wherein the micro-bumps include micro-bumps for power and ground connections, and the micro-bumps for power and ground connections are about opposite sides of the at least one array of micro-bumps.

6. The package including an integrated circuit of claim 1, wherein the at least one array of micro-bumps includes a first array of micro-bumps and a second array of micro-bumps, each of the first array of micro-bumps and the second array of micro bumps including a first set of micro-bumps and a second set of micro-bumps, the first set of micro-bumps being arranged in a pair of parallel lines, the second set of micro-bumps being arranged in a further pair of parallel lines parallel to the pair of parallel lines, the lines of the further parallel lines being separated by the pair of parallel lines of the first set of micro-bumps, the first set of micro-bumps of the first and second micro-bump arrays being configured for passage of current in a first direction and the second set of micro-bumps of the first and second micro-bump arrays being configured for passage of current in a second direction, the second direction opposite the first direction.

7. The package including an integrated circuit of claim 6, wherein the at least one array of micro-bumps includes a third array of micro-bumps between the first array of micro-bumps and the second array of micro-bumps, the third array of micro-bumps including the first set of micro-bumps and the second set of micro-bumps, the first set of micro-bumps of the third micro-bump array being configured for passage of current in the second direction and the second set of micro-bumps of the third micro-bump array being configured for passage of current in the first direction.

8. The package including an integrated circuit of claim 1, wherein a volume of the multi-layer substrate defined by the selected ones of the vias includes a magnetic material.

9. The package including an integrated circuit of claim 8, wherein the magnetic material is a ferrite.

\* \* \* \* \*